United States Patent [19]

Tauber et al.

[11] Patent Number: 5,418,215
[45] Date of Patent: May 23, 1995

[54] C-AXIS ORIENTED HIGH TEMPERATURE SUPERCONDUCTORS DEPOSITED ONTO SINGLE CRYSTALS OF GADOLINIUM GALLIUM GARNET AND METHOD OF MAKING THE SAME

[75] Inventors: Arthur Tauber, Elberon; Steven C. Tidrow, Eatontown, both of N.J.

[73] Assignee: The United States of America as represented by the Secretary of the Army, Washington, D.C.

[21] Appl. No.: 228,788

[22] Filed: Apr. 12, 1994

Related U.S. Application Data

[63] Continuation-in-part of Ser. No. 83,406, Jun. 22, 1993, abandoned.

[51] Int. Cl.⁶ .................................................. B32B 9/00
[52] U.S. Cl. .................................... 505/239; 428/688; 428/689; 428/700; 505/701; 505/238
[58] Field of Search ............... 428/688, 701, 700, 702, 428/689, 210, 930; 501/86; 505/701, 702, 734, 239, 237, 190, 193

[56] References Cited

U.S. PATENT DOCUMENTS

| | | | |
|---|---|---|---|
| 4,956,976 | 9/1990 | Kral | 62/51.3 |
| 5,093,311 | 3/1992 | Shiota | 505/701 |
| 5,106,828 | 4/1992 | Bhargava | 505/734 |
| 5,302,559 | 4/1994 | Mateika | 501/86 |

OTHER PUBLICATIONS

Oishi et al, Appl. Phys. Lett. 59(15) Oct. 7, 1991 pp. 1902–1904.
Koinuma et al., Jap Journ. of Appl. Phys. vol. 26, No. 5, May 1987 pp. L763–L765.
Geballe, Science vol. 259, Mar. 12, 1993, pp. 1550–1551.
Nakajima et al., Appl. Phys. Lett 53(15), Oct. 10, 1988 pp. 1437–1439.

*Primary Examiner*—Patrick J. Ryan
*Assistant Examiner*—Patrick Jewik
*Attorney, Agent, or Firm*—Michael Zelenka; Roy E. Gordon

[57] ABSTRACT c-axis oriented microwave quality HTSC films are deposited onto single crystals of gadolinium gallium garnet (GGG) using pulsed laser deposition (PLD) with conditions of 85 mTorr of oxygen partial pressure, a block temperature of 730° C., a substrate surface temperature of 790° C. and a laser fluence of 1 to 2 Joules/$cm_2$ at the target, a laser repetition rate of 10 Hz and a target to substrate distance of 7 cm and in which the a and b lattice parameters of the GGG exhibit a mismatch of less than 2.5 percent with the a and b lattice parameters of the HTSC.

3 Claims, No Drawings

C-AXIS ORIENTED HIGH TEMPERATURE SUPERCONDUCTORS DEPOSITED ONTO SINGLE CRYSTALS OF GADOLINIUM GALLIUM GARNET AND METHOD OF MAKING THE SAME

GOVERNMENT INTEREST

The invention described herein may be manufactured, used, and licensed by or for the Government of the United States of America without the payment to us of any royalty thereon.

CONTINUATION-IN-PART

This patent application is a continuation-in-part of U.S. patent application Ser. No. 08/083,406, now abandoned, filed Jun. 22, 1993 by Arthur Tauber and Steven C. Tidrow for "c-Axis Oriented Single Crystals of High Temperature Superconductors (HTSCs) Deposited onto Highly Oriented a and b Single Crystals of Gadolinium Gallium Garnet (GGG), Microwave Device Including the Structure, and Method of Making the Structure".

FIELD OF INVENTION

The invention relates in general to a method of depositing c-axis oriented epitaxial high critical temperature superconductors (HTSCs) onto crystallographically preferred orientations of single crystals of garnet, to the structure so made, and to a microwave device including the structure.

BACKGROUND OF THE INVENTION

Since the discovery of HTSCs, for example $YBa_2Cu_3O_{7-x}$ commonly known as Y-123, there has been a search for appropriate materials on which to grow HTSC thin film devices. Due to the chemical composition, crystal structure and anisotropic superconducting properties of HTSCs, the material used for thin film growth must be chemically compatible, match the HTSCs in temperature expansion coefficient and lattice parameter, exhibit low defect density and be mechanically strong. Epitaxial HTSC films deposited on such materials possess the best superconducting properties. For most device applications, the HTSC is deposited with the c-axis normal to the substrate surface since these fully oxygenated films possess the highest critical temperature ($T_c$), smallest transition width ($\Delta T_c$), largest critical current density ($J_c$) and lowest surface resistance ($R_S$). For microwave device applications requiring fast propagation and/or larger features, the material on which HTSC films are grown must be low loss, have a low dielectric constant and preferably be isotropic with respect to the microwave radiation.

Because garnets have reasonably low dielectric constants of $\epsilon$ from 9–13, reasonably low dielectric loss of $10^{-3}$, temperature expansion coefficients comparable to those of Y123, and are low cost substrates, they have been suggested as potential substrate materials for the fabrication of HTSC microwave devices. Several groups have attempted growing microwave quality HTSC films on gadolinium gallium garnet (GGG) but none have been successful due to improper lattice matching between GGG and the HTSC.

SUMMARY OF THE INVENTION

The general object of this invention is to provide a method of fabricating superior microwave devices and devices made by that method. A more particular object of the invention is to provide such a method wherein c-axis microwave device quality HTSC films are deposited on crystallographically preferred orientations of single crystals of garnet including GGG.

It has now been found that the aforementioned objects can be attained by depositing a Y-123 layer on a MgO substrate. This Y-123 film is c-axis oriented. A GGG layer having an orientation of (422)(211), (400)(100), (220)(440) or (420)(210) is then deposited on the Y-123 film. Finally, a second Y-123 layer is deposited atop the GGG layer forming a Y-123/GGG/Y-123 trilayer structure on the MgO substrate. This last deposited Y-123 layer also adopts a c-axis orientation providing excellent lattice matching between these last two layers, those layers becoming the operative portion of the microwave device.

DESCRIPTION OF THE PREFERRED EMBODIMENT

In the preferred embodiment of the invention, Y-123 is deposited onto a (100) MgO substrate using a pulsed layer deposition (PLD) technique. A GGG layer is then grown by PLD from a GGG target on the resulting c-axis oriented Y-123 film on the MgO substrate. A subsequent Y-123 layer is then deposited on the GGG layer. The resulting trilayer structure (Y-123/GGG/Y-123 on the MgO substrate) has been investigated by x-ray diffractometry. The diffraction peaks from the trilayer structure were identified as c-axis Y-123 as evidenced by the presence of sharp, intense (000) reflections on several orientations of the GGG [(440)(220), (100) (400), (210) (420), (211) (422)] layer on a c-axis Y-123 on (001) oriented MgO substrate.

The preferred growth conditions (block temperature of 730° C. and oxygen pressure 85 mTorr) differ drastically not only from the conditions used for optimal growth (850° C., 175 mTorr) of Y-123 on $LaAlO_3$ at this laboratory but also from those described in the literature for c-axis growth of Y-123 on commonly used substrates like $LaAlO_3$ by PLD.

Since GGG has a structural lattice match and chemical compatibility with the HTSCs (specifically $Tl_2Ca_2Ba_2Cu_3O_{10}$, $Tl_1Ca_2Ba_2Cu_3O_9$, $Tl_1Ca_2Ba_2Cu_3O_8$, and $REBa_2Cu_3O_{7-x}$ where RE is an element selected from the group consisting of Nd, Sm, Eu, Gd, Dy, Ho, Er, Tm, Yb and Lu), it should be possible to grow GGG and other garnet buffer layers on materials/substrates that lattice match the HTSCs such that c-axis HTSC films are obtained. In fact, it has been demonstrated that epitaxial GGG films that exhibit (422)(211), (210)(420), (400)(100) and (220)(440) orientation can be grown on MgO, $NdGaO_3$, $SrTiO_3$, $LaAlO_3$, and $Sr_2AlTaO_6$.

More particularly, according to the invention, c-axis oriented HTSCs are deposited on crystallographically preferred orientations of single crystals of GGG using a pulsed laser deposition technique (PLD), with conditions of about 1 to about 110 mTorr of oxygen partial pressure, a block temperature of about 690° to about 770° C., a substrate surface temperature of about 730° to about 830° C. and a laser fluence of 1 to 2 Joules/cm² at the target, a laser repetition rate of about 1 to 15 Hz and a target to substrate distance of 7 cm and in which the a and b lattice parameters of the GGG exhibit an effective lattice mismatch of less than 4.0 percent with the a and b lattice parameters of the HTSC.

Preferred in the foregoing deposition is the use of about 85 millitorr of oxygen, a block temperature of about 730° C., a laser fluence of 1 to 2 Joules/cm$^2$, a laser repetition rate of about 1 to 15 Hz and a mismatch of less than 4 percent.

A GGG single crystal substrate that has been found particularly useful has the very specific orientation, (422) or equivalently (211). That is, the (422) plane in single crystal GGG gives the best fit or match to the a b axis in the HTSC. Other orientations that provide a relatively good lattice match of a and b parameters to those of a c-axis oriented HTSC such as Y-123 and that can be used in the invention include (400)(100), (220)(440), and (420)(210) orientations of GGG.

Other garnets that can be used in the invention as a substrate or buffer layer include garnets having the general formula $RE_3Ga_5O_{12}$ and $RE_{3-x}RE_xGa_5O_{12}$ where RE and $RE_x$ are elements taken from the group of elements Pr, Nd, Sm, Eu, Gd, Dy, Ho, Er, Tm, Yb, Lu, and Y where $0 \leq x \leq 3$; garnets having the general formula $RE_3Al_5O_{12}$ and $RE_{3-x}RE_x,Al_5O_{12}$ where RE and $RE_x$ are elements taken from the group of elements Tb, Cy, Ho, Er, Tm, Yb, Lu, and Y and where $0 \leq x \leq 3$; garnets having the general formula $RE_{3-y}RE_yGa_{5-x}$-$Al_xO_{12}$ where RE and $RE_yGd$ are elements taken from the group of elements Tb, Dy, Ho, Er, Tm, Yb, La and Y where $0 \leq x \leq 3$ and $0 \leq x \leq 5$; are garnets having the general formula $Nd_3RE_2Ga_3O_{12}$ where RE is an element taken from the group of elements Er, Lu, Yb, Tm, Ho and Dy; garnets having the general formula $Nd_{3-y}RE_y,Re_2Ga_3O_{12}$ where $Re_y$ is Lu and where y is 1.1 and Ho and y is 1.65 and Dy and y is 1.9; garnets having the general formula $Nd_{3-y}RE_yRE_xGa_{2-x}$-$Ga_3O_{12}$ where RE is an element taken from the group Lu, Yb, Tm, Er, Ho, Dy where $0 \leq y \leq 3$ and $0 \leq x \leq 2$; garnets having the general formula $Ca_3 Al_2Ge_3O_{12}$, $Cd_3Al_2Ge_3O_{12}$ and $Ca_3MgGeJ_3O_{12}$ where J is an element taken from the group of elements Zr, Sn, and Ti; garnets having the general formula $Y_2Mg_3Ge_3O_{12}$, $Y_2Mg_3Ge_3O_{12}$; and $Ca_3RE_2Ge_3O_{12}$ where RE is an element taken from the group of elements Yb, Ho, Dy, Er, Tm, Yb, and Lu; a garnet having the general formula $Sr_3RE_2Ge_3O_{12}$ where RE is an element taken from the group of elements Ho, Tm, Yb, and Lu; garnets having the general formula $Ca_{3-y}Sr_yRE_{2-x}RE_x$-$Ge_3O_{12}$ where RE and $RE_x$ are elements taken from the group of elements Tm, Yb, Ho and Lu where $0 \leq y \leq 3$ and $0 \leq x \leq 2$ and garnets having the general formula $Mg_3Al_2Si_3O_{12}$ and $Cd_3Al_2Si_3O_{12}$.

Superior multilayer structures can be made by starting with a single crystal GGG substrate. Because the first HTSC layered deposited on the GGG substrate is highly c-axis oriented, a subsequent thin film buffer layer of GGG grows epitaxially on the HTSC. A subsequent thin film of HTSC can be grown on the GGG buffer layer. The end result is a multilayered structure having superior microwave properties.

While the GGG portion of the trilayer is predominantly (422) or equivalently (211) oriented, other orientations are present (220), (400), and (420) that are equivalently (110), (100) and (210) oriented, respectively. The possible growth direction of Y-123 on the various orientation of GGG are then investigated (by modeling) to see if appropriate lattice matching occurs. Using such modeling, the following lattice matches can be identified.

| GGG | Y-123 a = 3.82 Å | b = 3.89 Å | c = 11.68 Å |
|---|---|---|---|
| (100) or (400) | | | |
| a' | +0.27% | +2.10% | NA |
| b' | +0.27% | +2.10% | NA |
| (210) or (420) | | | |
| a' | −3.42% | −1.65% | NA |
| b' | +0.27% | +2.10% | NA |
| (220) or (440) | | | |
| a' | −1.83% | −0.03% | +0.05% |
| b' | +0.27% | +2.10% | NA |
| (211) or (422) | | | |
| a' | −1.83% | −0.03% | +0.05% |
| b' | −2.04% | −0.24% | NA |

In GGG ($Gd_3Ga_5O_{12}$), Gd can be replaced by the following rare-earths Pr, Nd, Sm, Eu, Dy, Er, Tm, Yb, Lu, and Y. As determined by computer simulation, the lattice match of the (422) plane of these gallates with the a' and b' axis of Y-123 are as follows:

| RE | Lattice Parameter | a' | b' |
|---|---|---|---|
| Pr | 12.57 | 3.35% | 1.55% |
| Nd | 12.506 | 1.03% | 3.10% |
| Sm | 12.432 | 2.28% | 0.65% |
| Eu | 12.401 | 2.02% | 0.39% |
| Dy | 12.307 | 1.25% | −0.37% |
| Er | 12.50 | 2.84% | 1.19% |
| Tm | 12.225 | 0.58% | −1.03% |
| Yb | 12.204 | 0.40% | −1.20% |
| Lu | 12.188 | 0.27% | −1.33% |
| Y | 12.180 | 1.03% | −0.57% |

Since the lattice match is so good (typically below 4% lattice mismatch of the a and b axis of Y-123), c-axis oriented growth can be attained on these planes. Other planes have been investigated by simulation and do not lattice match the Y-123 as well. No other planes of GGG will support high quality c-axis growth of Y-123; otherwise, other orientations of GGG would be observed to grow on the c-axis oriented Y-123 on MgO.

Next, Y-123 is deposited directly onto single crystal GGG substrate with (422) orientation. The highest quality Y-123 films which are c-axis oriented have a.c. eddy current responses of $T_c = 87$ K $\Delta T_c = 2-3$ K which is as good as Y-123 grown on MgO (100) substrates at this laboratory.

In lieu of Y-123 other HTSCs that can be used in the invention include $Tl_2Ca_2Ba_2Cu_3O_{10}$, $Tl_1Ca_2Ba_2Cu_3O_9$, $Tl_2Ba_2Ca_1Cu_2O_8$ and $REBa_2Cu_3O_{7-x}$ where RE is an element taken from the group of elements Y, Nd, Sm, Eu, Gd, Dy, Ho, Er, Tm, Yb and Lu.

In fact, we have demonstrated that epitaxial c-axis oriented $Gd_1Ba_2Cu_3O_{7-x}$ can be deposited on GGG single crystal substrate with (422) orientation.

Compounds that can be synthesized with the garnet structure range in lattice parameter from 11.30 to 12.76 Å. Within this range the effective lattice mismatch on garnet (211), (422), (220), (400), (210) planes to c-axis growth of YBCO is less than 7% and may be as small as 0%. The mismatch between c-axis oriented YBCO grown on (100) MgO is about 7%.

We wish it to be understood that we do not desire to be limited to the exact details of construction shown and described for obvious modifications will occur to a person skilled in the art.

What is claimed is:

1. A layer of a c-axis oriented high temperature superconductor grown on single crystals of garnet, that exhibit a mismatch of less than 2.5 percent with the a and b lattice parameters of the high temperature superconductor wherein the orientations, are selected from the group consisting of (211) (422), (400) (100), (220) (440), and (420) (210), wherein the high temperature superconductor is selected from the group consisting of $REBa_2Cu_3O_{7-x}$, $Tl_2Ca_2Ba_2Cu_3O_{10}$, $Tl_2Ca_2Ba_2Cu_3O_9$, and $Tl_2Ca_2Ba_2Cu_3O_{10}$, and wherein the garnets are selected from the group consisting of $RE_3 Ga_5 O_{12}$ and $RE_{3-x} RE_x Ga_5 O_{12}$ wherein RE and $RE_x$ are elements taken from the group of elements Pr, Nd, Sm, Eu, Gd, Dy, Ho, Er, Tm, Yb, W, and Y where $0 \leq x \leq 3$; garnets having the general formula $RE_3Al_5O_{12}$ and $RE_{3-x}RE_x,Al_5O_{12}$ where RE and $RE_x$ are elements taken from the group of elements Gd, Tb, Dy, Ho, Er, Tm, Yb, La, and Y and where $0 \leq y \leq 3$ and $0 \leq x \leq 3$; garnets having the general formula $Nd_3RE_2Ga_3O_{12}$ where RE is an element taken from the group of elements consisting of Er, Lu, Yb, Ot, Tm, Ho, and Dy; garnets having the general formula $Nd_{3-y}RE_yGa_3O_{12}$ where RE y is Lu and where Y is 1.1 and Ho and y is 1.65 and Dy and y is 1.9; garnets having the general formula $Nd_{3-y}RE_yRE_xGa_{2-x}Ga_3O_{12}$ where RE is an element taken from the group of elements Lu, Yb, Tm, Er, Ho, Dy where $0 \leq y \leq 3$ and $0 \leq x \leq 2$; garnets having the general formula $Ca_3Al_2Ge_3O_{12}$, $Cd_3Al_2Ge_3O_{12}$ and $Ca_3MgJGe_3O_{12}$ where J is an element taken from the group of elements Zr, Sn, and Ti; garnets having the general formula $Y_2Mg_3Ge_3O_{12}$, $Y_2Mg_3Ge_3O_{12}$; and $Ca_3RE_2Ge_3O_{12}$ where RE is an element taken from the group of elements Yb, Ho, Dy, Er, Tm, Yb, and Lu; a garnet having the general formula $Sr_3RE_2Ge_3O_{12}$ where RE is an element taken from the group of elements Ho, Tm, Yb, and Lu; garnets having the general formula $Ca_{3-y}Sr_yRE_{2-x}RE_x$ and $Ge_3O_{12}$ where RE and $RE_x$ are elements taken from the group of elements Tm, Yb, Ho and Lu where $0 \leq y \leq 3$ and $0 \leq x \leq 2$ and garnets having the general formula $Ca_3Al_2Si_3O_{12}$, $Mg_3Al_2Si_3O_{12}$ and $Cd_3Al_2Si_3O_{12}$.

2. A layer according to claim 1 wherein the orientation is (211).

3. A layer according to claim 1 wherein the high temperature superconductor is $Y_1Ba_2Cu_3O_{7-x}$ where $0 \leq x \leq 1$.

* * * * *